United States Patent
Bu et al.

(10) Patent No.: US 11,195,868 B2
(45) Date of Patent: Dec. 7, 2021

(54) IMAGE DISTANCE SENSOR AND MANUFACTURE METHOD THEREOF AS WELL AS A RANGING DEVICE

(71) Applicants: BEIJING BOE DISPLAY TECHNOLOGY CO., LTD., Beijing (CN); BOE TECHNOLOGY GROUP CO., LTD., Beijing (CN)

(72) Inventors: Qianqian Bu, Beijing (CN); Xin Li, Beijing (CN)

(73) Assignees: BEIJING BOE DISPLAY TECHNOLOGY CO., LTD., Beijing (CN); BOE TECHNOLOGY GROUP CO., LTD., Beijing (CN)

(*) Notice: Subject to any disclaimer, the term of this patent is extended or adjusted under 35 U.S.C. 154(b) by 108 days.

(21) Appl. No.: 16/442,200

(22) Filed: Jun. 14, 2019

(65) Prior Publication Data

US 2020/0020732 A1    Jan. 16, 2020

(30) Foreign Application Priority Data

Jul. 10, 2018 (CN) .......................... 201810749555.4

(51) Int. Cl.
| | | |
|---|---|---|
| H01L 21/00 | (2006.01) | |
| H01L 27/146 | (2006.01) | |
| G01S 15/08 | (2006.01) | |
| G01S 15/89 | (2006.01) | |

(52) U.S. Cl.
CPC ........ *H01L 27/14625* (2013.01); *G01S 15/08* (2013.01); *G01S 15/89* (2013.01); *H01L 27/14605* (2013.01); *H01L 27/14607* (2013.01)

(58) Field of Classification Search
None
See application file for complete search history.

(56) References Cited

U.S. PATENT DOCUMENTS

| | | | | |
|---|---|---|---|---|
| 6,852,565 | B1 * | 2/2005 | Zhao | H01L 27/14632 438/200 |
| 2003/0160887 | A1 * | 8/2003 | Takahashi | H01L 31/11 348/350 |
| 2006/0145213 | A1 * | 7/2006 | Ha | H01L 27/14623 257/292 |
| 2007/0070230 | A1 * | 3/2007 | Takahashi | H01L 27/14643 348/308 |

(Continued)

FOREIGN PATENT DOCUMENTS

| | | |
|---|---|---|
| CN | 1440078 A | 9/2003 |
| CN | 1819229 A | 8/2006 |
| CN | 1820349 A | 8/2006 |

(Continued)

OTHER PUBLICATIONS

First Office Action and English language translation, CN Application No. 201810749555.4, Mar. 31, 2020, 12 pp.

*Primary Examiner* — Ali Naraghi
(74) *Attorney, Agent, or Firm* — Myers Bigel, P.A.

(57) ABSTRACT

This disclosure provides an image distance sensor and a manufacture method thereof, as well as a ranging device. The image distance sensor includes a semiconductor substrate, and an image sensing unit and a distance sensing unit formed on the semiconductor substrate. The image sensing unit and the distance sensing unit are formed in a same manufacture process.

12 Claims, 5 Drawing Sheets

(56) References Cited

U.S. PATENT DOCUMENTS

2007/0204697 A1* 9/2007 Watanabe .............. G10K 9/122
73/649
2016/0351787 A1* 12/2016 Lin ....................... B06B 1/0688

FOREIGN PATENT DOCUMENTS

| CN | 101035394 A | 9/2007 |
| CN | 106291562 A | 1/2017 |
| JP | 2013-247216 A | 12/2013 |

* cited by examiner

IMAGE DISTANCE SENSOR AND MANUFACTURE METHOD THEREOF AS WELL AS A RANGING DEVICE

RELATED APPLICATION

The present application claims the priority of Chinese patent application for invention No. 201810749555.4, filed on Jul. 10, 2018, the entire disclosure of which is incorporated herein by reference.

TECHNICAL FIELD

This disclosure relates to the field of display technologies, and in particular to an image distance sensor and a manufacture method thereof, as well as a ranging device.

BACKGROUND ART

Automobiles have become important vehicles for modern people, so there is an important need of improving driving security. When a vehicle travels forward, the driver can see pedestrians, vehicles or targets clearly, but when the driver wants to park at the wayside, reverse the vehicle into a garage or drive backward, he/she needs to know the situation behind the vehicle with the help of a rear view mirror, a reverse radar or a reverse image device.

Due to the structural characteristics of rear view mirrors, when the driver observes a scene behind the vehicle with a rear view mirror, there can be a blind angle that is not observable, which increases the risk that the vehicle will bump into the targets or the pedestrians. A reverse radar is usually an ultrasonic sensor which measures distances by means of echoes. When the reverse radar begins to work, the sensor emits an ultrasonic signal, and when there is an obstacle behind the vehicle, the ultrasonic signal will be reflected by the obstacle, and the sensor will receive the reflected signal and process it by a controller to determine the distance between the obstacle and the rear end of the vehicle. Although the reverse radar can accurately measure the distance between the obstacle and the rear end of the vehicle, it can only remind the driver of how far/close the rear end of the vehicle is from/to the obstacle by means of the frequency of beeps, and the driver cannot see the shape and the position of the obstacle. A reverse image device is usually provided with a camera device at the rear end of the vehicle so that the driver can see clearly the obstacle behind the vehicle through a display inside the vehicle. Although the reverse image device can display the shape and the position of the obstacle in an intuitional manner, the driver cannot know the real distance between the obstacle and the rear end of the vehicle, and as a result, he/she has to stare at the display all the time.

Nowadays, a technical solution providing both a reverse radar function and a reverse image function has been proposed in the prior art, in which the reverse radar directly measures a distance between the rear end of the vehicle and the obstacle and prompts the driver, and the driver observes the display of the reverse image device upon receipt of the prompt and thus accurately learns about information of the scene behind the vehicle. However, in the above technical solution, the reverse radar is an independent device, so is the reverse image device. They are actually a combined structure for implementing two functions by using two separate parts respectively, which leads to defects such as low integration, large volume, high costs and so on.

SUMMARY

The technical problem solved by the embodiments of this disclosure is to provide an image distance sensor and a manufacture method thereof, as well as a ranging device, so as to overcome the defects such as low integration, large volume, high costs and so on in the existing combined solution.

According to one aspect of this disclosure, an image distance sensor is provided, comprising a semiconductor substrate and an image sensing unit and a distance sensing unit formed on the semiconductor substrate, wherein the image sensing unit and the distance sensing unit are formed in one and the same manufacture process.

In one embodiment, the image sensing unit comprises a pixel circuit and a photosensitive unit formed on the semiconductor substrate, the pixel circuit comprises: a first well region and a second well region formed in the semiconductor substrate, the first well region being provided with a first doping region and the second well region being provided with a second doping region, and the first well region and the second well region having different semiconductor types; a first gate and a second gate formed on the first well region and the second well region; a first insulating layer covering the first gate and the second gate; and a first source, a first drain, a second source and a second drain formed on the first insulating layer, wherein the first source and the first drain are connected with the first doping region through via holes penetrating the first insulating layer, the second source and the second drain are connected with the second doping region through via holes penetrating the first insulating layer, and the first drain is connected and with the second source.

In an embodiment, the photosensitive unit comprises: a third well region formed in the semiconductor substrate, the third well region being provided with a third doping region, and the third doping region and the third well region having different semiconductor types; and a first electrode formed on the third doping region, the first electrode being connected with the second drain of the pixel circuit.

In an embodiment, the distance sensing unit comprises: a resonant cavity formed in the semiconductor substrate; a first insulating layer covering the resonant cavity; a piezoelectric layer formed on the first insulating layer; a second insulating layer covering the piezoelectric layer; and a first drive electrode and a second drive electrode formed on the second insulating layer, the first drive electrode and the second drive electrode being connected with the piezoelectric layer through via holes penetrating the second insulating layer respectively.

In an embodiment, the image distance sensor further comprises a first lead wire, a second lead wire and a third lead wire formed on the second insulating layer, wherein the first lead wire is connected with the first source of the pixel circuit through a via hole penetrating the second insulating layer, the second lead wire is connected with the first drain and the second source of the pixel circuit through a via hole penetrating the second insulating layer, and the third lead wire is connected with the second drain of the pixel circuit and the first electrode of the photosensitive unit through a via hole penetrating the second insulating layer.

In an embodiment, the image distance sensor further comprises a filter layer, the filter layer including a plurality of filter units arranged in an array, each of the filter units being used for transmitting light of a color.

In an embodiment, the image distance sensor further comprises a light collection layer, the light collection layer including a plurality of lens units arranged in an array, the lens units being used for converging incident light to the photosensitive unit of the image sensing unit.

According to another aspect of this disclosure, a ranging device is provided, comprising any image distance sensor mentioned above.

According to yet another aspect of this disclosure, a manufacture method of an image distance sensor is provided, comprising: forming an image sensing unit and a distance sensing unit on a semiconductor substrate in one and the same manufacture process.

In one embodiment, the step of forming an image sensing unit and a distance sensing unit on a semiconductor substrate in one and the same manufacture process comprises: forming on the semiconductor substrate a pixel circuit and a photosensitive unit of the image sensing unit, and a resonant cavity of the distance sensing unit; and forming an ultrasonic sensing unit on the resonant cavity.

In one embodiment, the step of forming on the semiconductor substrate a pixel circuit and a photosensitive unit of the image sensing unit and a resonant cavity of the distance sensing unit comprises: forming in the semiconductor substrate a first well region, a second well region and a third well region, the first well region having different semiconductor types as the second well region, and the third well region having the same semiconductor type as the first well region or the second well region; forming a first gate and a second gate on the first well region and the second well region respectively; forming a first doping region, a second doping region and a third doping region in the first well region, the second well region and the third well region respectively, the first doping region having the same semiconductor type as the first well region, the second doping region having the same semiconductor type as the second well region, and the third doping region and the third well region having different semiconductor types; forming a resonate cavity in the semiconductor substrate; and forming a first insulating layer covering the first gate, the second gate and the resonant cavity; and forming a first source, a first drain, a second source, a second drain and a first electrode on the first insulating layer, the first source and the first drain being connected with the first doping region through via holes penetrating the first insulating layer, the second source and the second drain being connected with the second doping region through via holes penetrating the first insulating layer, the first electrode being connected with the third doping region through a via hole penetrating the first insulating layer, the first drain being connected with the second source, and the second drain being connected with the first electrode.

In an embodiment, the step of forming an ultrasonic sensing unit on the resonant cavity comprises: forming a piezoelectric layer on the first insulating layer; forming a second insulating layer covering the piezoelectric layer; and forming a first drive electrode and a second drive electrode on the second insulating layer, the first drive electrode and the second drive electrode being connected with the piezoelectric layer through via holes penetrating the second insulating layer respectively.

In an embodiment, in the step of forming a first drive electrode and a second drive electrode on the second insulating layer, a first lead wire, a second lead wire and a third lead wire are formed at the same time, the first lead wire being connected with the first source of the pixel circuit through a via hole penetrating the second insulating layer, the second lead wire being connected with the first drain and the second source of the pixel circuit through a via hole penetrating the second insulating layer, and the third lead wire is connected with the second drain of the pixel circuit and the first electrode of the photosensitive unit through a via hole penetrating the second insulating layer.

In an embodiment, the manufacture method further comprises: forming a filter layer, the filter layer including a plurality of filter units arranged in an array, each of the filter units being used for transmitting light of a color.

In an embodiment, the manufacture method further comprises: forming a light collection layer, the light collection layer including a plurality of lens units arranged in an array, the lens units being used for converging incident light to the photosensitive unit of the image sensing unit.

The embodiments of this disclosure provide an image distance sensor and a manufacture method thereof as well as a ranging device, and by forming an image sensing unit and a distance sensing unit on the semiconductor substrate in one and the same process, the image sensing function and the distance sensing function are organically integrated in one sensor, thereby effectively overcoming the defects such as low integration, large volume, high costs and so on in the existing combined solution.

Apparently, any product or process implementing this disclosure may not have to achieve all of the above advantages at the same time. Other features and advantages of this disclosure will be detailed in the subsequent embodiments of the description, and will partly become obvious from the embodiments of the description, or be understood by carrying out this disclosure. Goals and other advantages of the embodiments of this disclosure can be realized and achieved from structures specifically pointed out in the description, the claims and the drawings.

BRIEF DESCRIPTION OF DRAWINGS

The drawings are used to provide further understanding of the technical solutions of this disclosure and constitute part of the description. They are used to explain the technical solutions of this disclosure instead of limiting them. Shapes and sizes of components in the drawings do not reflect true ratios, but instead they are only provided to illustrate the content of the disclosure.

DETAILED DESCRIPTION OF EMBODIMENTS

The specific implementation of this disclosure will be further explained in detail with reference to the drawings and the embodiments. The embodiments below are used for explaining this disclosure rather than limiting the scope of this disclosure. It should be noted that the embodiments in this disclosure and the features of the embodiments can be combined with each other arbitrarily under the circumstances that there is no conflict.

Figure 1:
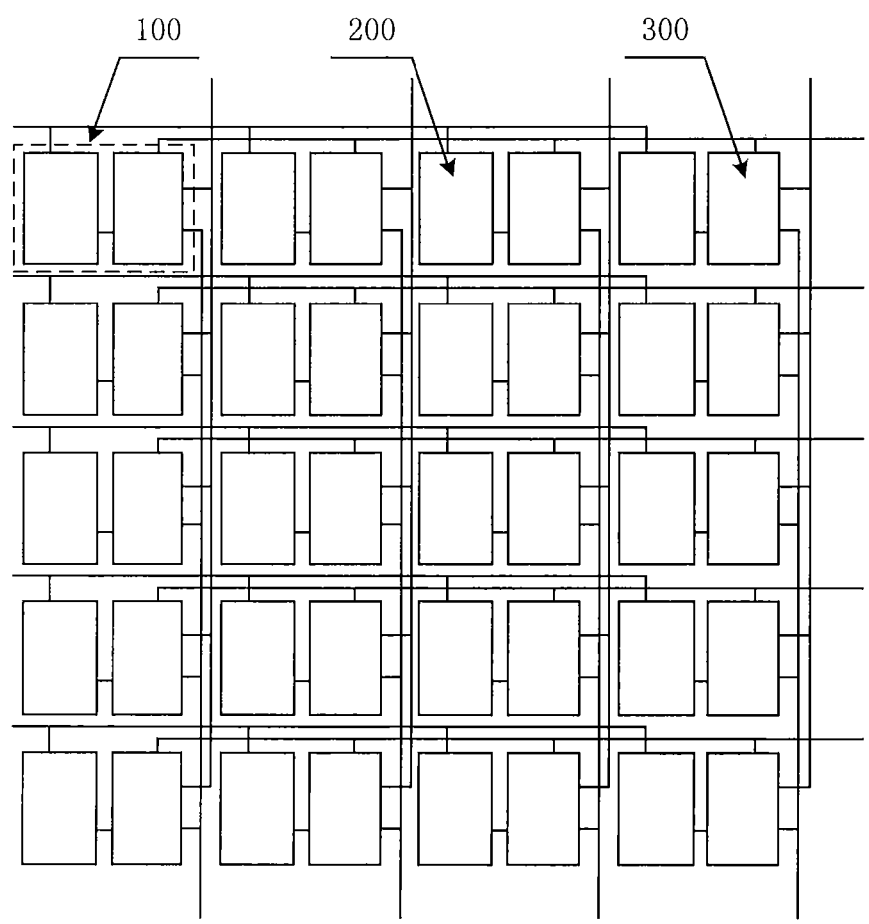
FIG. 1 is a schematic structure view of an image distance sensor according to an embodiment of this disclosure.

FIG. 1 is a schematic structure view of an image distance sensor according to an embodiment of this disclosure. As shown in FIG. 1, the main structure of the image distance sensor comprises a plurality of pixel units 100 arranged in an array. The plurality of pixel units 100 are provided with image sensing units 200 for acquiring images and distance sensing units 300 for acquiring distances. The image sensing unit 200 and the distance sensing unit 300 are formed on a semiconductor substrate and manufactured at the same time in one and the same manufacture process.

In one embodiment, each pixel unit 100 comprises an image sensing unit 200 and a distance sensing unit 300 arranged in parallel, the image sensing unit 200 being formed on one side of the pixel unit 100, and the distance sensing unit 300 being formed on the other side of the pixel unit 100, which forms an overall layout that the image sensing units 200 and the distance sensing units 300 are arranged alternatingly on the semiconductor substrate.

FIG. 1 only schematically shows a structure of the pixel unit comprising an image sensing unit and a distance sensing unit arranged in parallel, and according to an embodiment of this disclosure, the pixel unit may also have a structure with an up-down arrangement, e.g., the distance sensing unit is on top and the image sensing unit underneath, or vice versa. In another embodiment, it may also have such a structure that a pixel unit 100 is provided with an image sensing unit 200 and a further pixel unit 100 adjacent thereto is provided with a distance sensing unit 300, which also forms an overall layout that the image sensing units 200 and the distance sensing units 300 are arranged alternatingly on the semiconductor substrate. Besides, the image sensing unit and the distance sensing unit according to the embodiments of this disclosure may also be arranged such that a plurality of adjacent pixel units 100 are provided with an image sensing unit 200 each to form an imaging region and a pixel unit 100 is provided with a distance sensing unit 300 to form a ranging region, the imaging region and the ranging region being arranged alternatingly. Alternatively, a plurality of adjacent pixel units 100 are provided with a distance sensing unit 300 each to form a ranging region and a pixel unit 100 is provided with an image sensing unit 200 to form an imaging region, the imaging region and the ranging region being arranged alternatingly. The adjacent pixel units can be either pixel units adjacent in the same row or pixel units adjacent in the same column. The alternating arrangement of the image sensing unit and the distance sensing unit can expand the detection range to the maximum extent. In actual implementation, for a structure in which the pixel unit is provided with both an image sensing unit and a distance sensing unit, occupation areas of the two sensing units can be arranged upon needs of imaging and ranging, e.g., the image sensing unit occupies ¾ of the pixel region, and the distance sensing unit occupies only ¼ of the pixel region, and so on.

The image sensing unit 200 for acquiring images comprises a photosensitive unit for sensing visible light and a pixel circuit for processing photo-generated charge data, the photosensitive unit and the pixel circuit being connected with each other. The pixel circuit is a Complementary Metal-Oxide Semiconductor (CMOS) circuit, comprising a Positive Channel Metal Oxide Semiconductor (PMOS) transistor and a Negative Channel Metal Oxide Semiconductor (NMOS) transistor. The photosensitive unit is used for sensing visible light and performing photoelectric signal conversion, comprising a PN junction Photo Diode (PD), a heavily doped second semiconductor type region of the photodiode is located on top of a heavily doped first semiconductor type region. Specifically, when the first semiconductor type is P type and the second semiconductor type is N type, the heavily doped N type region (N+ region) of the PN junction photodiode is located on top of the heavily doped P type region (P+ region); when the first semiconductor type is N type and the second semiconductor type is P type, the heavily doped P type region (P+ region) of the PN junction photodiode is located on top of the heavily doped N type region (N+ region).

The distance sensing unit 300 comprises an ultrasonic sensing unit for generating and receiving ultrasonic signals and a resonant cavity for resonating. The ultrasonic sensing unit comprises a piezoelectric layer, and a first drive electrode and a second drive electrode connected with the piezoelectric layer respectively. The piezoelectric layer is made of an organic piezoelectric material, including polyvinylidene fluoride (PVDF).

The pixel circuit comprises: a first well region and a second well region formed in the semiconductor substrate, the first well region being provided with a first doping region and the second well region being provided with a second doping region, and the first well region and the second well region having different semiconductor types; a first gate and a second gate formed on the first well region and the second well region; a first insulating layer covering the first gate and the second gate; and a first source, a first drain, a second source and a second drain formed on the first insulating layer. The first source and the first drain are connected with the first doping region through via holes penetrating the first insulating layer, the second source and the second drain are connected with the second doping region through via holes penetrating the first insulating layer, and the first drain is connected with the second source electrode.

The photosensitive unit comprises: a third well region formed in the semiconductor substrate, the third well region having the same semiconductor type as either of the first well region and the second well region, the third well region being provided with a third doping region, the third doping region and the third well region having different semiconductor types; and a first electrode formed on the third doping region, the first electrode being connected with the second drain of the pixel circuit.

The distance sensing unit comprises: a resonant cavity formed in the semiconductor substrate; a first insulating layer covering the resonant cavity; a piezoelectric layer formed on the first insulating layer; a second insulating layer covering the piezoelectric layer; and a first drive electrode and a second drive electrode formed on the second insulating layer. The first drive electrode and the second drive electrode are connected with the piezoelectric layer through via holes penetrating the second insulating layer respectively. The piezoelectric layer, the first drive electrode and the second drive electrode constitute an ultrasonic sensing unit.

The image distance sensor further comprises a first lead wire, a second lead wire and a third lead wire formed on the second insulating layer. The first lead wire is connected with the first source of the pixel circuit through a via hole penetrating the second insulating layer, the second lead wire is connected with the first drain and the second source of the pixel circuit through a via hole penetrating the second insulating layer, and the third lead wire is connected with the second drain of the pixel circuit and the first electrode of the photosensitive unit through a via hole penetrating the second insulating layer.

The image distance sensor further comprises a filter layer, the filter layer including a plurality of filter units arranged in an array, each of the filter units being used for transmitting light of a color.

The image distance sensor further comprises a light collection layer, the light collection layer including a plurality of lens units arranged in an array, the lens units being used for converging incident light to the photosensitive unit.

In the image distance sensor provided in the embodiments of this disclosure, by forming on the semiconductor substrate at the same time in one and the same process an image sensing unit for acquiring images and a distance sensing unit for acquiring distances, and arranging the image sensing unit and the distance sensing unit in a same pixel unit or in different pixels, the image sensing function and the distance sensing function are organically integrated in one sensor, thereby effectively overcoming the defects such as low integration, large volume, high costs and so on in the existing combined solution, improving the integration to the maximum extent, decreasing the volume of the product and reducing the production costs.

FIG. 2~FIG. 12 are schematic views shown the process of manufacturing an image distance sensor according to the embodiments of this disclosure.

The technical solutions according to the embodiments of this disclosure will be explained in detail with reference to the manufacture process of the image distance sensor as shown in FIG. 2~FIG. 10. The "patterning process" mentioned in each embodiment comprises treatments such as depositing a film layer, coating with a photoresist, exposing with a mask, developing, etching, stripping the photoresist and so on, which are existing manufacturing processes. The deposition can be known processes such as sputtering, evaporation, chemical vapor deposition, and the coating can be a known coating process, and the etching can adopt a known method, which will not be limited specifically herein. During the manufacture process below, the first semiconductor type is P type and the second semiconductor type is N type for example, but the manufacture process is also applicable to a solution in which the first semiconductor type is N type and the second semiconductor type is P type.

Figure 2:
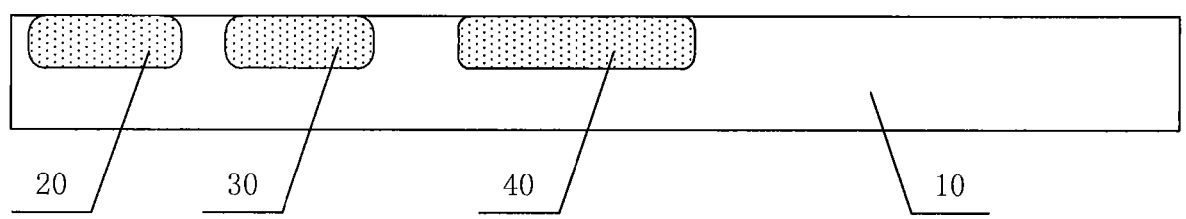
FIG. 2 is a schematic view after the formation of patterns of well regions according to an embodiment of this disclosure.

1. Forming patterns of well regions on the semiconductor substrate 10. Forming patterns of well regions comprises: forming a first P well region 20, N well region 30 and a second P well region 40 on the semiconductor substrate 10 by an ion implantation process as shown in FIG. 2. The first P well region and the second P well region can be obtained by implanting P-type ions in a predetermined region of the semiconductor substrate 10, and the N well region can be obtained by implanting N-type ions in a predetermined region of the semiconductor substrate 10.

The semiconductor substrate can be any of a silicon substrate, a germanium substrate and a silicon germanium substrate, or any of a Silicon On Insulator (SOI) substrate, a Germanium On Insulator (GOI) substrate and a Silicon Germanium On Insulator (SGOI) substrate, and it is not limited thereto.

The semiconductor substrate may also have a structure of a semiconductor layer formed on a transparent substrate, or a buffer layer and a semiconductor layer formed on a transparent substrate, and the transparent substrate can be a glass substrate, a quartz substrate, an organic resin substrate or the like, and the buffer layer can be a silicon nitride layer, a silicon oxide layer, a silicon oxynitride layer or a composite layer thereof.

Figure 3:
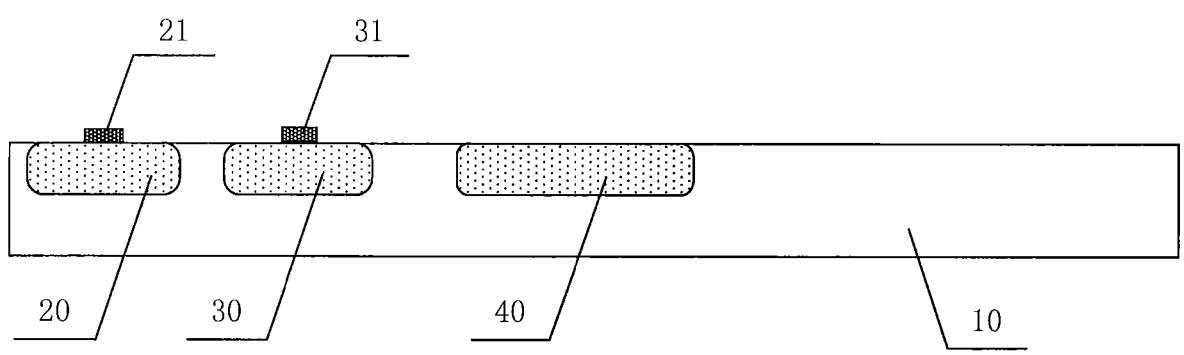
FIG. 3 is a schematic view after the formation of patterns of a CMOS gate according to an embodiment of this disclosure.

2. Forming patterns of a CMOS gate. Forming patterns of a CMOS gate comprises: based on the formation of the above patterns, after depositing a polysilicon layer, performing doping treatment first, and then forming patterns of a first gate 21 and a second gate 31 by a patterning process, as shown in FIG. 3. The first gate 21 is located in the first P well region 20 as a polysilicon gate of a PMOS transistor, and the second gate 31 is located in the N well region 30 as a polysilicon gate of an NMOS transistor. Forming patterns of a first gate and a second gate by a patterning process can comprise: coating the polysilicon layer with a layer of photoresist, exposing and developing the photoresist, forming an unexposed region and retaining the photoresist in a position where the first gate and the second gate are located, forming a fully exposed region and removing the photoresist in other regions, etching the polysilicon layer in the fully exposed region by an etching process, stripping the remnant photoresist, and forming patterns of a first gate and a second gate.

Deposition of the polysilicon layer can also be implemented by other methods. For example, an amorphous silicon layer can be deposited first, and then treatments such as dehydrogenation and excimer laser annealing are performed on the amorphous silicon layer to convert amorphous silicon into polysilicon, thereby forming a polysilicon layer. Besides, the first gate and the second gate can also be made of metal materials.

Figure 4:
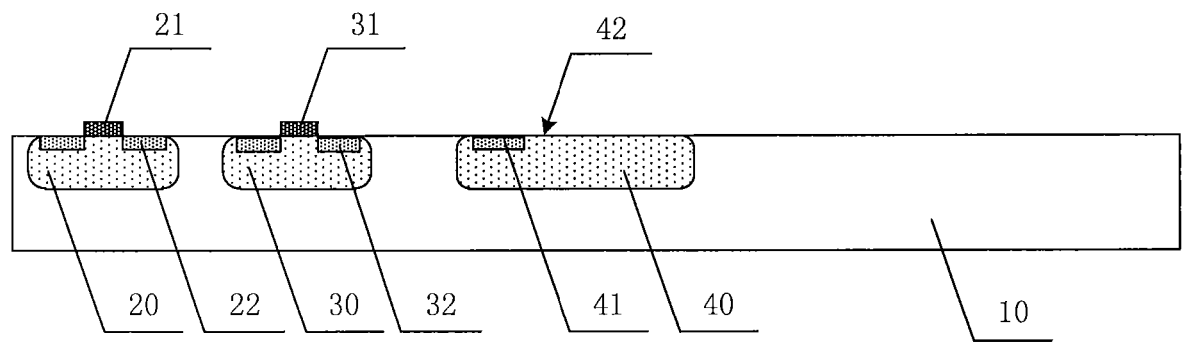
FIG. 4 is a schematic view after the formation of patterns of doping regions and a photodiode according to an embodiment of this disclosure.

3. Forming patterns of doping regions and a photodiode. Forming patterns of doping regions and a photodiode comprises: based on the formation of the above patterns, applying a layer of photoresist, exposing and developing the photoresist, performing doping treatment by ion implantation, forming a first doping region 22 in the first P well region 20, forming a second doping region 32 in the N well region 30, and forming a third doping region 41 in the second P well region 40, as shown in FIG. 4.

The first doping region 22 is P-type ion doped and located on both sides of the first gate 21 as the source and the drain of the PMOS transistor such that a region of the first P well region 20 beneath the first gate 21 serves as the channel of the PMOS transistor. The second doping region 32 is N-type ion doped and located on both sides of the second gate 31 as the source and the drain of the NMOS transistor such that a region of the N well region 30 beneath the second gate 31 serves as the channel of the NMOS transistor. The third doping region 41 is N-type ion doped and located within part of the second P well region 40 such that the second P well region 40 and the N-type semiconductor formed thereon constitute a PN junction of a photodiode and form a photodiode 42, and the other part of the second P well region 40 is a light reception surface that receives visible light to generate carriers passing through a spatial charge region of the PN junction and thus generate a photoelectric current, thereby achieving visible light detection.

The first doping region, the second doping region and the third doping region can be obtained by implanting N-type ions or P-type ions in a predetermined region respectively, and depths of the ions implanted can be either the same or different, and concentrations of the ions doped can be either the same or different, which will not be specifically limited herein. The process of forming well regions and doping regions by ion implantation is well known for those skilled in the art, which will not be elaborated herein for simplicity.

Figure 5:
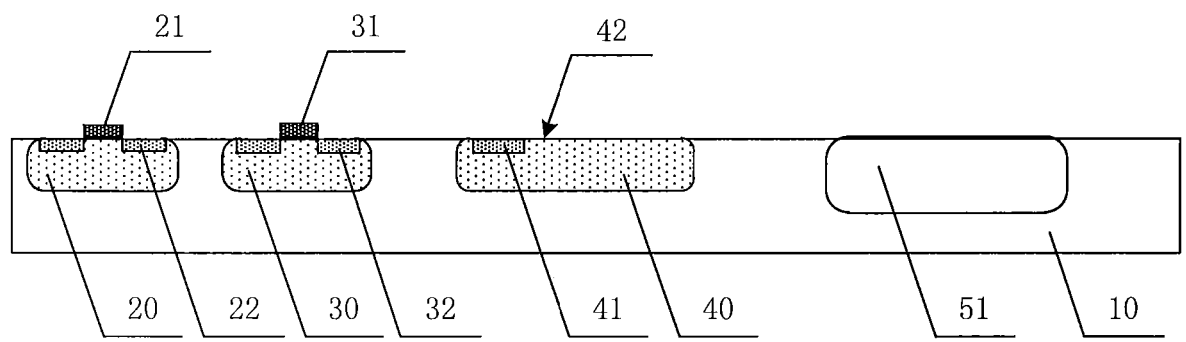
FIG. 5 is a schematic view after the formation of patterns of a resonant cavity according to an embodiment of this disclosure.

4. Forming patterns of a resonant cavity. Forming patterns of a resonant cavity comprises: based on the formation of the above patterns, applying a layer of photoresist, exposing and developing the photoresist, forming a fully exposed region and removing the photoresist in a position where the patterns of the resonant cavity are located, forming an unexposed region and retaining the photoresist in other regions, etching part of the thickness of the semiconductor substrate in the fully exposed region by an etching process, stripping the remnant photoresist, and forming patterns of a resonant cavity 51 in the semiconductor substrate 10, as shown in FIG. 5. The etching can be performed by an Inductively Couple Plasma Etch (ICP) approach and thus etching of the resonant cavity can be achieved by taking advantage of the characteristics of the ICP approach such as anisotropy, high etch rate, high etch selectivity with respect to different materials, controllability of the process and so on.

Figure 6:
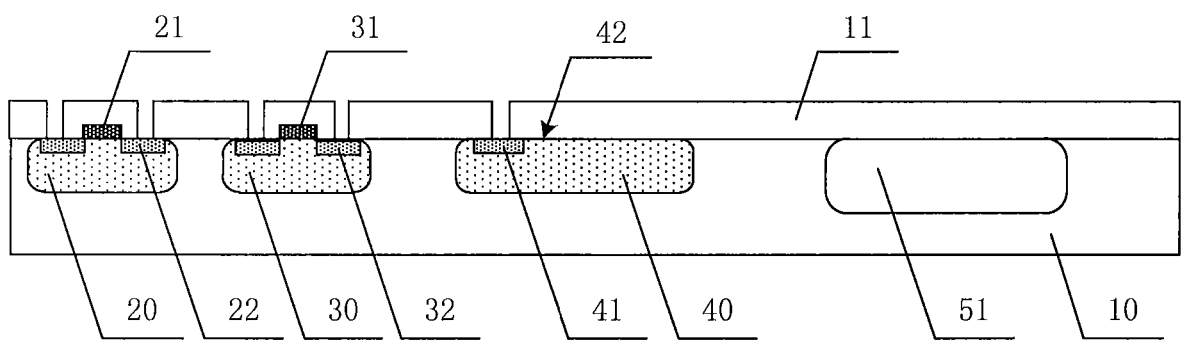
FIG. 6 is a schematic view after the formation of patterns of a first insulating layer according to an embodiment of this disclosure.

5. Forming patterns of a first insulating layer. Forming patterns of a first insulating layer comprises: based on the formation of the above patterns, depositing a first insulating layer 11 and forming patterns of a plurality of via holes in the first insulating layer 11 by a patterning process, as shown in FIG. 6. The plurality of via holes are located in the first doping region 22 of the first P well region 20, the second doping region 32 of the N well region 30 and the third doping region 41 of the second P well region 40 respectively. The first insulating layer can be a silicon nitride layer, a silicon oxide layer, a silicon oxynitride layer or a composite layer thereof.

Figure 7:
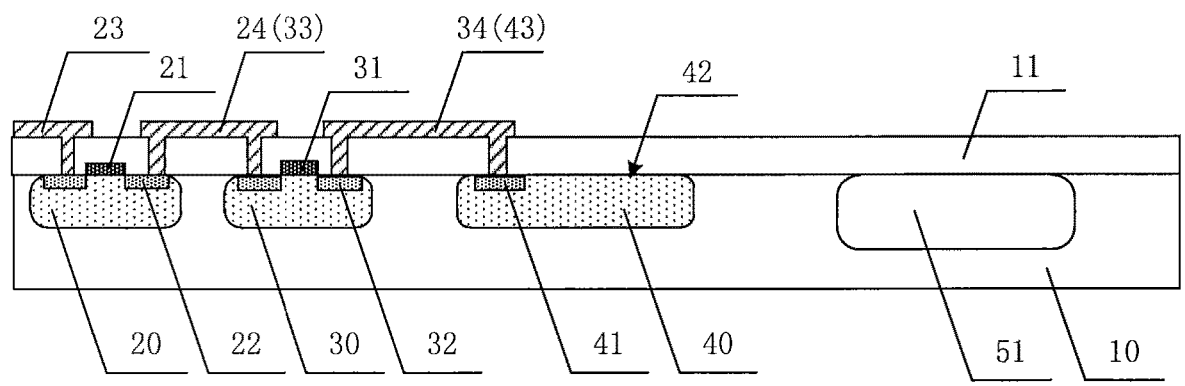
FIG. 7 is a schematic view after the formation of patterns of a CMOS source-drain according to an embodiment of this disclosure.

6. Forming patterns of a CMOS source-drain. Forming patterns of a CMOS source-drain comprises: based on the formation of the above patterns, depositing a first metal layer, and forming on the first insulating layer 11 patterns of a first source 23, a first drain 24, a second source 33, a second drain 34 as well as a first electrode 43 of the photodiode 42 respectively by performing a patterning process on the first metal layer. The first source 23 and the first drain 24 respectively serve as the source and the drain of the PMOS transistor, and the second source 33 and the second drain 34 respectively serve as the source and the drain of the NMOS transistor. The source 23 of the PMOS transistor and the drain 24 of the PMOS transistor are connected with the first doping region 22 of the first P well region 20 through via holes penetrating the first insulating layer 11 respectively, and the source 33 of the NMOS transistor and the drain 34 of the NMOS transistor are connected with the second doping region 32 of the N well region 30 through via holes penetrating the first insulating layer 11 respectively, the first electrode 43 of the photodiode 42 is connected with the third doping region 41 of the second P well region 40 through a via hole penetrating the first insulating layer 11, and the drain 24 of the PMOS transistor is connected with the source 33 of the NMOS transistor, and the drain 34 of the NMOS transistor is connected with the first electrode 43 of the photodiode 42, as shown in FIG. 7.

After the above procedures, a CMOS circuit and a photodiode connected with each other are formed, wherein the CMOS circuit comprises a PMOS transistor and an NMOS transistor connected with each other, the PMOS transistor serving as a PMOS readout circuit and the NMOS transistor serving as an NMOS readout circuit. The PMOS transistor comprises a first gate 21, a source 23, a drain 24 and a channel, and the NMOS transistor comprises a second gate 31, a source 33, a drain 34 and a channel. In the CMOS circuit, either of the NMOS transistor and the PMOS transistor is turned on, or both transistors are turned off, so the power consumption is very low.

In the embodiments of this disclosure, the photosensitive unit is a photodiode having a PN structure which has advantages such as good linearity, low noise, low costs, long service life and low operating voltage. The operation principle of a photodiode having a PN structure is that an ordinary diode is in an OFF state under the effect of a reverse voltage so only passage of a weak reverse current is allowed, while a photodiode is designed and manufactured such that an area of the PN junction is as large as possible in order to receive incident light. The photodiode can operate under the effect of the reverse voltage, and when there is no light, the reverse current is very weak, which is called dark current; when there is light, the reverse current rapidly increases to several dozen microamp, which is called photocurrent. The greater the intensity of light is, the greater the reverse current is. Changes in light lead to changes in the current of the photodiode, and the photodiode can convert light signals into electrical signals and hence becomes a photosensor. In actual implementation, the PN junction of the photodiode can also be mixed with a layer of semiconductor having a low concentration, thereby forming a photodiode with a PIN structure. For a photodiode with a PN structure, the P-type semiconductor and the N-type semiconductor can either have a stack structure as in this embodiment, or have a same layer structure. Besides, in order to reduce interference, an opaque pattern can also be formed on the semiconductor substrate such that an orthogonal projection of the photodiode on the semiconductor substrate is located within an orthogonal projection of the opaque pattern on the semiconductor substrate.

In the embodiments of this disclosure, the N-type ions doped in the N-type semiconductor of the photodiode are the same as the N-type ions doped in the N-type semiconductor of the NMOS transistor, and are doped in one and the same doping process, and the first electrode of the photodiode, the source and the drain of the PMOS transistor and the source and the drain of the NMOS transistor are formed in one and the same patterning process, so the manufacture process is simplified. For other types of transistors, the manufacture process is similar to the above manufacture process, and for those skilled in the art, several improvement and expansion can also be made without deviating from the principle of this disclosure, and such improvement and expansion should also be regarded as solutions of this disclosure.

Figure 8:
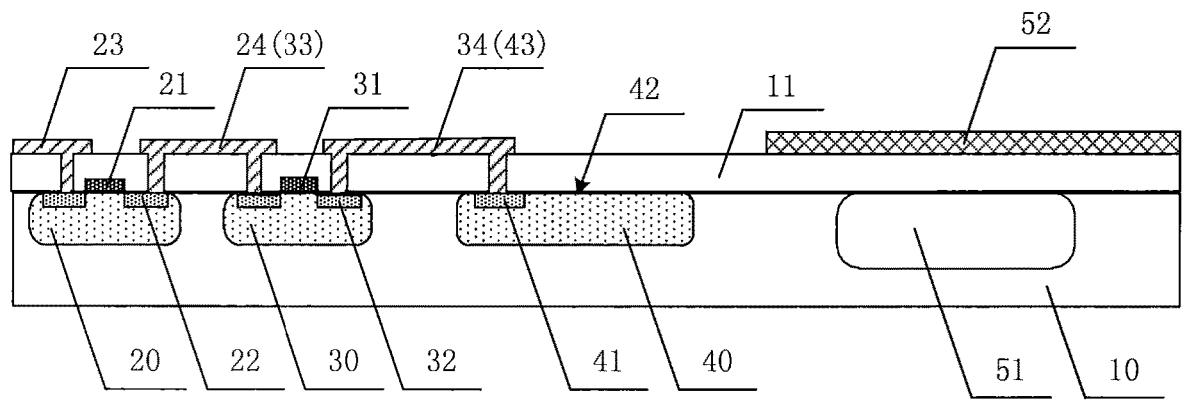
FIG. 8 is a schematic view after the formation of patterns of a piezoelectric layer according to an embodiment of this disclosure.

7. Forming patterns of a piezoelectric layer. Forming patterns of a piezoelectric layer comprises: based on the formation of the above patterns, depositing a piezoelectric material layer and forming patterns of a piezoelectric layer 52 in a position corresponding to the patterns of the resonant cavity 51 on the first insulating layer 11 by performing a patterning process on the piezoelectric material layer, as shown in FIG. 8. The piezoelectric layer can be made of an organic piezoelectric material such as polyvinylidene fluoride (PVDF), or a piezoelectric ceramic material such as aluminum magnesium niobate, or a lead zirconate titanate piezoelectric ceramic composite crystal (PZT) material, aluminum nitride or the like.

Figure 9:
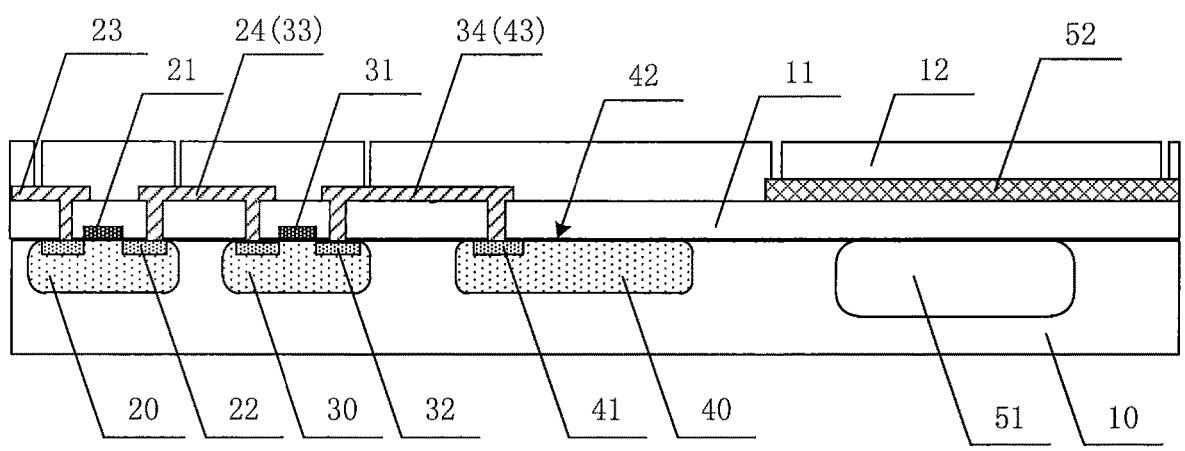
FIG. 9 is a schematic view after the formation of patterns of a second insulating layer according to an embodiment of this disclosure.

8. Forming patterns of a second insulating layer. Forming patterns of a second insulating layer comprises: based on the formation of the above patterns, depositing a second insulating layer 12 and forming patterns of a plurality of via holes in the second insulating layer 12 by a patterning process, as shown in FIG. 9. The plurality of via holes are located on the source 23 of the PMOS transistor, the source 33 of the NMOS transistor, the first electrode of the photodiode 42 and both sides of the piezoelectric layer 52. The second insulating layer can be a silicon nitride layer, a silicon oxide layer, an aluminum oxide layer, a silicon oxynitride layer or a composite layer thereof.

Figure 10:
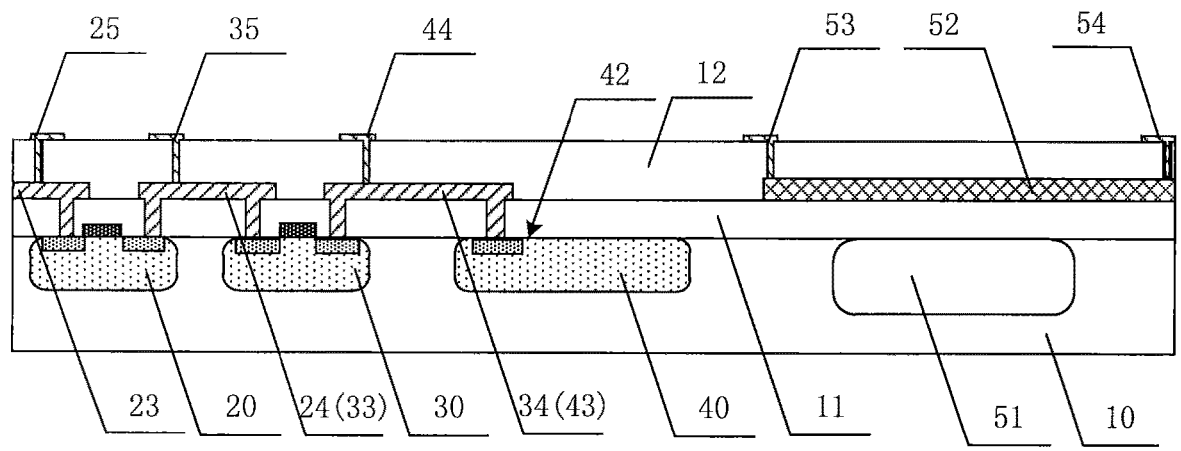
FIG. 10 is a schematic view after the formation of patterns of lead wires and drive electrodes according to an embodiment of this disclosure.

9. Forming patterns of lead wires and drive electrodes. Forming patterns of lead wires and drive electrodes comprises: based on the formation of the above patterns, depositing a second metal layer, and forming on the second insulating layer 12 patterns of a first lead wire 25, a second lead wire 35, a third lead wire 44, a first drive electrode 53 and a second drive electrode 54 respectively by performing a patterning process on the second metal layer, as shown in FIG. 10. The first lead wire 25 is connected with the source 23 of the PMOS transistor through a via hole penetrating the second insulating layer 12, the second lead wire 35 is connected with the drain 24 of the PMOS transistor and the source 33 of the NMOS through a via hole penetrating the second insulating layer 12, and the third lead wire 44 is connected with the drain 34 of the NMOS transistor and the first electrode 43 of the photodiode 42 through a via hole penetrating the second insulating layer 12, and the first drive electrode 53 and the second drive electrode 54 are connected with both ends of the piezoelectric layer 52 through via holes penetrating the second insulating layer respectively.

After the above procedures, a distance sensing unit for acquiring distance parameters is formed. The distance sensing unit comprises a resonant cavity 51 formed in the semiconductor substrate and an ultrasonic sensing unit. The ultrasonic sensing unit comprises a piezoelectric layer 52, a first drive electrode 53 and a second drive electrode 54, the first drive electrode 53 and the second drive electrode 54 being connected with the piezoelectric layer 52 respectively, and the first insulating layer 11 between the resonant cavity 51 and the piezoelectric layer 52 serving as a barrier layer.

The distance sensing unit in the embodiments of this disclosure is also called an ultrasonic transducer which is used for generating ultrasonic signals and receiving ultrasonic signals reflected from an obstacle and converting them into electrical signals. The volume structure of the resonant cavity depends on its design, and once it is designed, its resonant frequency is fixed. When the frequency of the ultrasonic waves generated by the ultrasonic sensing unit is the same as that of the resonant cavity, resonance occurs in the resonant cavity, which increases the amplitude of the ultrasonic waves such that the amplitude is maximized after the ultrasonic waves pass through the resonant cavity. In an ultrasonic generating stage, a signal processing circuit provides a pulse electrical signal which is transmitted to the first drive electrode and the second drive electrode via a drive line such that an inverse piezoelectric effect occurs in the piezoelectric layer of the ultrasonic sensing unit, and high-frequency mechanical deformation generates ultrasonic waves which propagate to the resonant cavity. Since the frequency of the ultrasonic waves is the same as the inherent frequency of the resonant cavity, the ultrasonic waves passing through the resonant cavity resonate, which increases the amplitude of the ultrasonic waves before they are transmitted outwards. In an ultrasonic receiving stage, since the ultrasonic waves are reflected when they meet an obstacle and the reflected ultrasonic waves are signals having a certain sound pressure, the piezoelectric layer is deformed, and the piezoelectric layer is excited by the in-plane oscillation to generate voltage signals which are transmitted to an external signal processing circuit by a sensing signal line. By calculating a time difference between the transmitting time of the ultrasonic waves and the receiving time thereof, the signal processing circuit can obtain distance parameters of the obstacle. The principle of receiving and converting the reflected ultrasonic signals by the ultrasonic transducer is well known for those skilled in the art, which will not be elaborated herein for simplicity.

Figure 11:
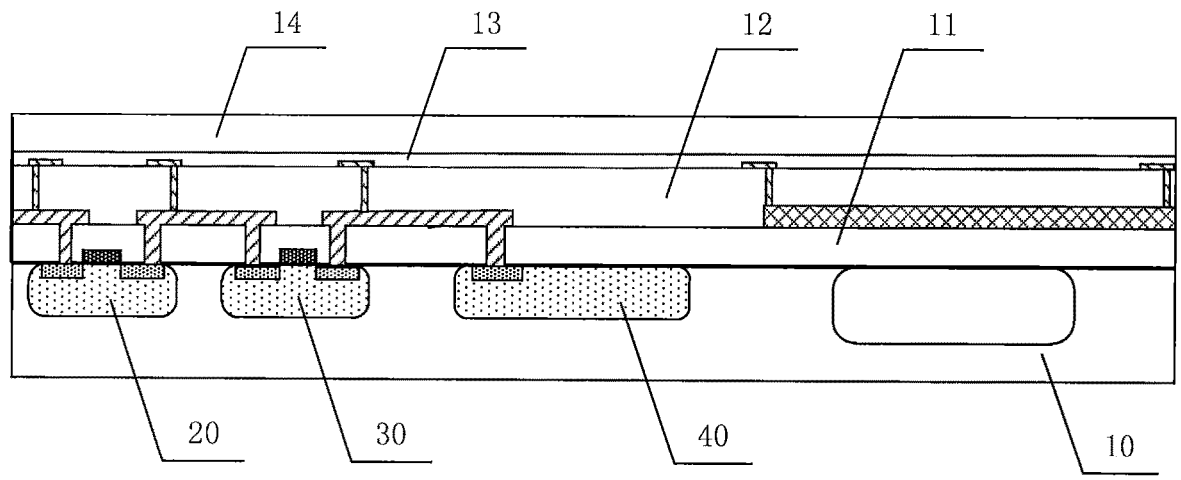
FIG. 11 is a schematic view after the formation of patterns of a filter layer according to an embodiment of this disclosure.

10. Forming patterns of a filter layer. Forming patterns of a filter layer comprises: based on the formation of the above patterns, depositing a third insulating layer 13 first, then sequentially applying red, green and blue photoresists, and forming a filter layer 14 comprising a plurality of filter units by a patterning process, as shown in FIG. 11. In the embodiments of this disclosure, the plurality of filter units are arranged in an array, and each filter unit is mainly used for transmitting light of a color and filtering light of other colors such that each pixel unit only responses to light of a color, which improves the photosensitive performance of the photodiode. For example, for red light, green light and blue light, each filter unit only allows one of them to pass through. The third insulating layer can be a silicon nitride layer, a silicon oxide layer, a silicon oxynitride layer or a composite layer thereof.

Figure 12:
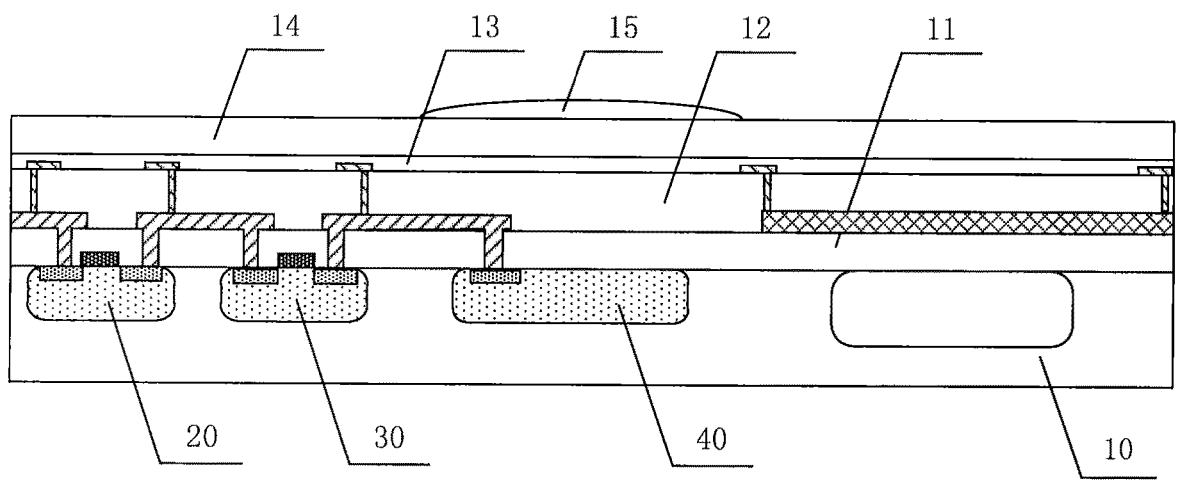
FIG. 12 is a schematic view after the formation of patterns of a light collection layer according to an embodiment of this disclosure.

11. Forming patterns of a light collection layer. Forming patterns of a light collection layer comprises: based on the formation of the above patterns, applying a transparent thin film, and forming a light collection layer 15 comprising a plurality of lens units by a patterning process, as shown in FIG. 12. The plurality of lens units are arranged in an array, and each lens unit comprises one or more microlens structures for converging the incident light into the photosensitive unit, the position and the size of the microlens structures corresponding to the position and the size of the photodiode 42. In the embodiments of this disclosure, the lens unit is mainly used for converging the incident light, collecting more incident light onto the surface of the photodiode, increasing the intensity of light impinging on the photodiode, improving the photosensitive performance of the photodiode and increasing the sensitivity of the pixel unit.

Although the technical solutions of the embodiments of this disclosure are illustrated above by forming patterns of the well regions on the semiconductor substrate first, the structure and the manufacture method of the image distance sensor of the embodiments of this disclosure are not limited thereto. In fact, all structures and manufacture methods of the existing CMOS circuits, and all structures and manufacture methods of the existing ultrasonic transducers are applicable to the embodiments of this disclosure, which will not be elaborated herein for simplicity.

As can be seen from the above explanations, in the image distance sensor provided in the embodiments of this disclosure, by forming an image sensing unit for acquiring images and a distance sensing unit for acquiring distances on the semiconductor substrate at the same time in one and the same process, the image sensing function and the distance sensing function are organically integrated in one sensor, thereby effectively overcoming the defects such as low integration, large volume, high costs and so on in the existing combined solution. Since the image sensing unit and the distance sensing unit can be arranged in a same pixel unit or in different pixels, the integration is improved to the maximum extent, which truly realizes an integrated structure and reduces the product volume. Since the doping treatment of the photodiode and the doping treatment of the PMOS transistor and the NMOS transistor are carried out in one and the same doping process, the first electrode of the photodiode, the source and the drain of the PMOS transistor and the source and the drain of the NMOS transistor are formed in one and the same patterning process, and the first drive electrode and the second drive electrode of the ultrasonic sensing unit and the lead wires of the pixel circuit are formed in one and the same patterning process, the production costs are effectively reduced. Besides, the arrangement of a filter layer and a light collection layer improves the photosensitive performance of the photodiode and improves the sensitivity of the pixel unit.

Based on the technical concept of the embodiments of this disclosure, a manufacture method of an image distance sensor is further provided in the embodiments of this disclosure. The manufacture method of an image distance sensor comprises: forming an image sensing unit and a distance sensing unit on a semiconductor substrate in one and the same manufacture process.

Forming an image sensing unit and a distance sensing unit on a semiconductor substrate in one and the same manufacture process comprises:

S1, forming on the semiconductor substrate a pixel circuit and a photosensitive unit of the image sensing unit, and a resonant cavity of the distance sensing unit;

S2, forming an ultrasonic sensing unit on the resonant cavity.

Step S1 comprises:

S11, forming in the semiconductor substrate a first well region, a second well region and a third well region, the first well region and the second well region having different semiconductor types, and the third well region having the same semiconductor type as the first well region or the second well region;

S12, forming a first gate and a second gate on the first well region and the second well region respectively;

S13, forming a first doping region, a second doping region and a third doping region in the first well region, the second well region and the third well region respectively, the first doping region having the same semiconductor type as the first well region, the second doping region having the same semiconductor type as the second well region, and the third doping region and the third well region having different semiconductor types;

S14, forming a resonate cavity in the semiconductor substrate;

S15, forming a first insulating layer covering the first gate, the second gate and the resonant cavity;

S16, forming a first source, a first drain, a second source, a second drain and a first electrode on the first insulating layer, the first source and the first drain being connected with the first doping region through via holes penetrating the first insulating layer, the second source and the second drain being connected with the second doping region through via holes penetrating the first insulating layer, the first electrode being connected with the third doping region through a via hole penetrating the first insulating layer, the first drain being connected with the second source, and the second drain being connected with the first electrode.

Step S2 comprises:

S21, forming a piezoelectric layer on the first insulating layer;

S22, forming a second insulating layer covering the piezoelectric layer;

S23, forming a first drive electrode and a second drive electrode on the second insulating layer, the first drive electrode and the second drive electrode being connected with the piezoelectric layer through via holes penetrating the second insulating layer.

When the first drive electrode and the second drive electrode are formed on the second insulating layer, a first lead wire, a second lead wire and a third lead wire are formed at the same time, the first lead wire being connected with the first source of the pixel circuit through a via hole penetrating the second insulating layer, the second lead wire being connected with the first drain and the second source of the pixel circuit through a via hole penetrating the second insulating layer, and the third lead wire is connected with the second drain of the pixel circuit and the first electrode of the photosensitive unit through a via hole penetrating the second insulating layer.

The manufacture method further comprises: forming a filter layer, the filter layer including a plurality of filter units arranged in an array, each of the filter units being used for transmitting light of a color.

The manufacture method further comprises: forming a light collection layer, the light collection layer including a plurality of lens units arranged in an array, the lens units being used for converging incident light to the photosensitive unit of the image sensing unit.

The specific content of the manufacture method of an image distance sensor according to the embodiments of this disclosure has been introduced in detail in the manufacture process of the image distance sensor, which will not be repeated herein for simplicity.

The embodiments of this disclosure further provides a ranging device, the ranging device comprising any image distance sensor according to the above embodiments. The image distance sensor comprises a plurality of pixel units arranged in an array, the plurality of pixel units being provided with an image sensing unit for acquiring images and a distance sensing unit for acquiring distances. When each pixel unit comprises an image sensing unit and a distance sensing unit, the image sensing unit is formed on one side of the pixel unit and the distance sensing unit is formed on the other side of the pixel unit, which forms an overall layout that the image sensing units and the distance sensing units are arranged alternatingly. When a pixel unit is provided with an image sensing unit and a further pixel unit adjacent thereto is provided with a distance sensing unit, an overall layout that the image sensing units and the distance sensing units are arranged alternatingly is also formed.

Figure 13:
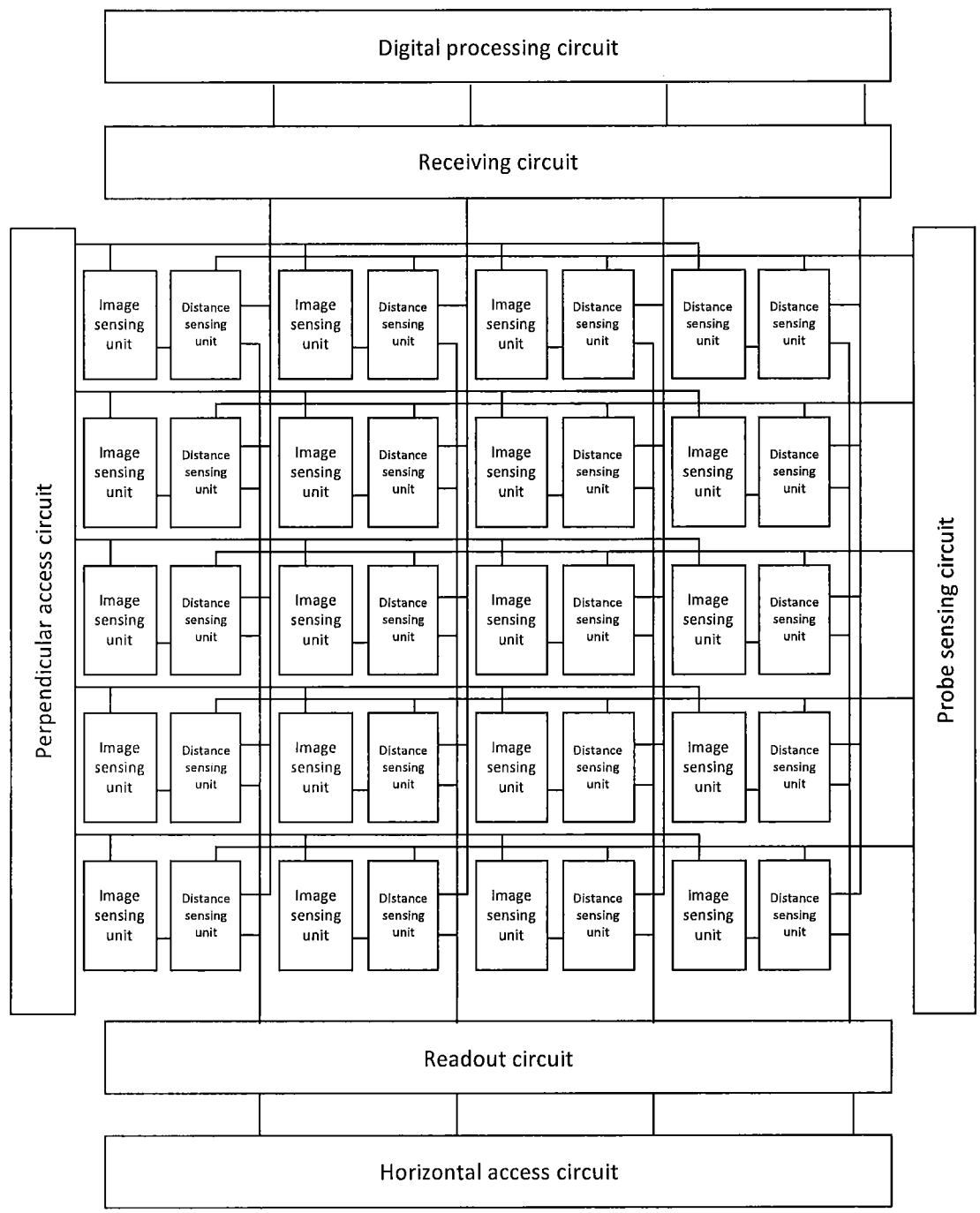
FIG. 13 is a schematic structure view of a ranging device according to an embodiment of this disclosure.

The overall layout that the image sensing units and the distance sensing units are arranged alternatingly can achieve separate control of the image sensing units and the distance sensing units by arranging a plurality of independent drive lines between the pixel units in combination with respective external processing circuits, thereby achieving high integration of the reverse radar ranging function and the reverse image display function. FIG. 13 is a schematic structure view of a ranging device according to an embodiment of this disclosure. As shown in FIG. 13, the external processing circuit comprises a perpendicular access circuit, a horizontal access circuit, a receiving circuit, a readout circuit, a probe sensing circuit, a digital processing circuit and so on. Common designs of the art can be adopted for the layout of the external processing circuit and the circuit structure of the specific circuit, which will not be elaborated for simplicity.

In the description of this disclosure, it should be understood that directional or positional relations indicated by terms such as "center", "up", "down", "front", "rear", "vertical", "horizontal", "top", "bottom", "inner" and "outer" are directional or positional relations shown on the basis of the drawings. They are used only for describing this disclosure and simplifying the description, instead of indicating or implying that the indicated devices or elements must be orientated specifically, or constructed and operated in a specific orientation, so they cannot be construed as limiting this disclosure.

In the description of this disclosure, it should be noted that terms of "install", "link" and "connect" should be understood in a broad sense unless otherwise prescribed and defined explicitly. For example, "connect" can refer to fixed connection, or detachable connection, or integrated connection; it can also refer to mechanical connection or electrical connection; or direct connection, or indirect connection via intermediate media, or even connection inside two elements. For a person having ordinary skills in the art, the specific meanings of the above terms in this disclosure can be understood upon specific situations.

Although the implementations of this disclosure are disclosed above, the contents thereof only relate to implementations adopted for understanding this disclosure instead of limiting this disclosure. Any skilled person in the art of this disclosure can make any modifications and variations in terms of forms and details of the implementations without deviating from the spirits and scopes disclosed in this disclosure. The protection scope of this disclosure is subjected to the scope defined in the appended claims.

The invention claimed is:

1. An image distance sensor, comprising:
a semiconductor substrate;
an image sensing unit; and
a distance sensing unit formed on the semiconductor substrate,
wherein the image sensing unit and the distance sensing unit are formed in a same manufacture process,
wherein the image sensing unit comprises a pixel circuit and a photosensitive unit formed on the semiconductor substrate, and wherein the pixel circuit comprises:
  a first well region and a second well region formed in the semiconductor substrate, the first well region comprising a first doping region and the second well region comprising a second doping region, wherein the first well region and the second well region having different semiconductor types;
  a first gate and a second gate on the first well region and the second well region;
  a first insulating layer on the first gate and the second gate; and
  a first source, a first drain, a second source and a second drain on the first insulating layer,
  wherein the first source and the first drain are connected to the first doping region through via holes penetrating the first insulating layer,
  wherein the second source and the second drain are connected to the second doping region through the via holes penetrating the first insulating layer,
  wherein the first drain is connected to a second source electrode, and wherein the photosensitive unit comprises:
    a third well region in the semiconductor substrate, wherein the third well region comprises a third doping region, and wherein the third doping region and the third well region have different semiconductor types; and
    a first electrode on the third doping region, the first electrode being connected to the second drain of the pixel circuit.

2. The image distance sensor according to claim 1, further comprising:
a filter layer,
wherein the filter layer comprises a plurality of filter units arranged in an array, and
wherein each of the filter units is configured to transmit light of a respective color.

3. The image distance sensor according to claim 1, further comprising:
a light collection layer,
wherein the light collection layer comprises a plurality of lens units arranged in an array, and
wherein the plurality of lens units are configured to converge incident light to a photosensitive unit of the image sensing unit.

4. A ranging device comprising the image distance sensor according to claim 1.

5. The ranging device according to claim 4, wherein the image sensing unit further comprises:
a filter layer,
wherein the filter layer comprises a plurality of filter units arranged in an array, and
wherein each of the filter units is configured to transmit light of a respective color.

6. An image distance sensor, comprising:
a semiconductor substrate;
an image sensing unit; and
a distance sensing unit formed on the semiconductor substrate,
wherein the image sensing unit and the distance sensing unit are formed in a same manufacture process,
wherein the image sensing unit comprises a pixel circuit and a photosensitive unit formed on the semiconductor substrate, and
wherein the pixel circuit comprises:
  a first well region and a second well region formed in the semiconductor substrate, the first well region comprising a first doping region and the second well region comprising a second doping region, wherein the first well region and the second well region having different semiconductor types;
  a first gate and a second gate on the first well region and the second well region;
  a first insulating layer on the first gate and the second gate; and
  a first source, a first drain, a second source and a second drain on the first insulating layer,
  wherein the first source and the first drain are connected to the first doping region through via holes penetrating the first insulating layer,
  wherein the second source and the second drain are connected to the second doping region through the via holes penetrating the first insulating layer,
wherein the first drain is connected to a second source electrode,
wherein the distance sensing unit comprises:
a resonate cavity in the semiconductor substrate;
a first insulating layer on the resonate cavity;
a piezoelectric layer on the first insulating layer;

a second insulating layer on the piezoelectric layer; and
a first drive electrode and a second drive electrode on the second insulating layer,
wherein the first drive electrode and the second drive electrode are connected to the piezoelectric layer through via holes penetrating the second insulating layer respectively.

7. The image distance sensor according to claim 6, further comprising:
a first lead wire, a second lead wire and a third lead wire formed on the second insulating layer,
wherein the first lead wire is connected to the first source of the pixel circuit through a first via hole of the via holes penetrating the second insulating layer,
wherein the second lead wire is connected to the first drain and the second source of the pixel circuit through a second via hole of the via holes penetrating the second insulating layer, and
wherein the third lead wire is connected to the second drain of the pixel circuit and a first electrode of the photosensitive unit through a third via hole of the via holes penetrating the second insulating layer.

8. A ranging device comprising the image distance sensor according to claim 6.

9. The ranging device according to claim 8, wherein the image sensing unit further comprises:
a first lead wire,
a second lead wire and
a third lead wire on the second insulating layer,
wherein the first lead wire is connected to the first source of the pixel circuit through a first via hole of the via holes penetrating the second insulating layer,
wherein the second lead wire is connected to the first drain and the second source of the pixel circuit through a second via hole of the via holes penetrating the second insulating layer, and
wherein the third lead wire is connected to the second drain of the pixel circuit and a first electrode of the photosensitive unit through a third via hole of the via holes penetrating the second insulating layer.

10. The ranging device according to claim 8, wherein the image sensing unit further comprises:
a filter layer,
wherein the filter layer comprises a plurality of filter units arranged in an array, and
wherein each of the filter units is configured to transmit light of a respective color.

11. The image distance sensor according to claim 6, further comprising:
a filter layer,
wherein the filter layer comprises a plurality of filter units arranged in an array, and
wherein each of the filter units is configured to transmit light of a respective color.

12. The image distance sensor according to claim 6, further comprising:
a light collection layer,
wherein the light collection layer comprises a plurality of lens units arranged in an array, and
wherein the plurality of lens units are configured to converge incident light to a photosensitive unit of the image sensing unit.

* * * * *